(12) United States Patent
Choi et al.

(10) Patent No.: US 7,816,861 B2
(45) Date of Patent: Oct. 19, 2010

(54) DISPLAY DEVICE AND MANUFACTURING METHOD THEREFOR

(75) Inventors: Beohm-rock Choi, Seoul (KR); Un-cheol Sung, Gyeonggi-do (KR); Jung-soo Rhee, Seoul (KR); Young-rok Song, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 158 days.

(21) Appl. No.: 12/030,786

(22) Filed: Feb. 13, 2008

(65) Prior Publication Data

US 2009/0026927 A1 Jan. 29, 2009

(30) Foreign Application Priority Data

Jul. 27, 2007 (KR) .................... 10-2007-0075800

(51) Int. Cl.
    *H01J 63/04* (2006.01)
(52) U.S. Cl. ..................................... 313/504
(58) Field of Classification Search ................ 313/483, 313/498, 504–506; 345/76, 92; 257/59, 257/72; 315/169.1, 169.3
See application file for complete search history.

(56) References Cited

U.S. PATENT DOCUMENTS

2007/0018926 A1* 1/2007 Shin et al. ..................... 345/92
2007/0080377 A1* 4/2007 Sung et al. ................... 257/253

\* cited by examiner

*Primary Examiner*—Joseph L Williams
*Assistant Examiner*—Brenitra M Lee
(74) *Attorney, Agent, or Firm*—Innovation Counsel LLP

(57) ABSTRACT

A display device, includes: an insulating substrate; a common electrode which is formed on the insulating substrate; a common voltage applying layer which is formed between the insulating substrate and the common electrode, and comprises an upper surface which faces the common electrode and a side surface of the opposite sides of the upper surface; and an organic insulating layer which is formed between the insulating substrate and the common electrode, and is formed with a contact hole which exposes at least a part of the side surface of the common voltage applying layer, the common electrode electrically connected to a side surface contact portion of the common voltage applying layer which is exposed through the contact hole.

14 Claims, 19 Drawing Sheets

DISPLAY DEVICE AND MANUFACTURING METHOD THEREFOR

CROSS-REFERENCE TO RELATED APPLICATION

This application claims priority from Korean Patent Application No. 10-2007-0075800, filed on Jul. 27, 2007 in the Korean Intellectual Property Office, the disclosure of which is incorporated herein by reference in its entirety.

BACKGROUND OF THE INVENTION

1. Field of the Invention

The present invention relates to a display apparatus and a manufacturing method thereof.

2. Description of the Related Art

An OLED display device includes a substrate, a plurality of thin film transistors provided on the substrate for driving, a pixel electrode forming a pixel, a common electrode employed for a reference voltage, and an emitting material layer provided between the pixel electrode and the common electrode. If a voltage is applied to the pixel electrode and the common electrode, a hole and an electron combine to generate an exciton. The exciton transitions to the ground state and emits light in the emitting material layer. The OLED display device controls the emitted light to display an image.

An OLED display device is classified as a top emission type in which the light is emitted out through a common electrode or a bottom emission type in which the light is emitted through the substrate.

The OLED display device of the top emission type includes the common electrode formed of a transparent conductive metal formed mainly of indium tin oxide (ITO) or indium zinc oxide (IZO). Since the common electrode formed of ITO or IZO has too large a resistance to appropriately apply a common voltage to the common electrode, a common voltage applying layer for compensating the common voltage is accessorily provided. The common voltage applying layer is formed of a metal wiring layer on the substrate, and is connected with the common electrode by a plurality of contact holes.

In the OLED display device, an organic layer such as a hole injection layer and an electron transfer layer may be formed for the entire display area of the substrate by using an open mask. However, when an open mask is used, the organic layer is deposited in the contact hole used for connecting with the common electrode so that it is difficult to connect the common electrode to the common voltage applying layer. Accordingly, in the depositing of the organic layer, it is necessary to use a shadow mask, thereby complicating the manufacturing process, and increasing manufacturing cost.

SUMMARY OF THE INVENTION

Accordingly, it is an aspect of the present invention to provide a display device having a simplified, lower cost manufacturing process.

The foregoing and/or other aspects of the present invention can be achieved by providing a display device, comprising: common electrode formed on an insulating substrate; a common voltage applying layer formed between the insulating substrate and a common electrode so that the upper side surface of the common voltage applying layer faces the common electrode and the lower side surfaces of the common voltage applying layer face layers of an organic layer. The organic layers and an organic insulating layer are formed between the insulating substrate and the common electrode. The organic insulating layer and is formed with a contact hole which exposes at least a part of the side surfaces of the common voltage applying layer. The common electrode is electrically connected to a side surface contact portion of the common voltage applying layer which is exposed through the contact hole.

The side surface contact portion of the common voltage applying layer may be elongated in a lengthwise direction of the common voltage applying layer.

The side surface contact portion of the common voltage applying layer may be formed in plural to be distanced in the lengthwise direction of the common voltage applying layer.

An outer angle between the side surface of the common voltage applying layer which may be exposed through the contact hole, and the insulating substrate is less than 90 degree.

The common voltage applying layer may be formed as multi layers, and the area of an upper layer of the common voltage applying layer is bigger than the area of a lower layer thereof.

The display device may comprise: a pixel electrode which is formed between the insulating substrate and the common electrode, and an emitting material layer which may be formed between the pixel electrode and the common electrode, wherein a light which may be generated from the emitting material layer is emitted out through the common electrode.

The display device may comprise: a distanced area which is exposed by the contact hole, and is formed so that at least a part of the side surface of the common voltage applying layer can be distanced from the organic insulating layer, and an organic layer which may be formed on the distanced area, wherein the organic layer may be thinner than the common voltage applying layer.

At least a part of the organic layer which may be formed on the distanced area is formed by a thermal evaporation.

The thickness of the common voltage applying layer may be 2000 Å to 4000 Å.

The common voltage applying layer may be formed as the same layer as the pixel electrode.

The display device may comprise a sub common voltage applying layer which is positioned between the common voltage applying layer and the insulating substrate, and is electrically connected with the common voltage applying layer, wherein a common voltage may be applied to at least one of the common voltage applying layer and the sub common voltage applying layer.

The contact hole may comprise a layering preventing column which exposes and contacts at least a part of the upper surface of the common voltage applying layer, and has a lower surface which contacts the common voltage applying layer. The upper surface of the layering preventing column advantageously has a larger area than its lower surface. The common electrode may be electrically connected to the exposed upper surface of the common voltage applying layer which is out of contact with the layer preventing column.

The display device may comprise: a distanced area which is exposed by the contact hole, and is formed so that at least one part of the side surface of the common voltage applying layer can be distanced from the organic insulating layer, and an organic layer which may be formed on the distanced area, wherein the organic layer may be thinner than the common voltage applying layer.

The foregoing and/or other aspects of the present invention can be achieved by providing a display device, comprising: an insulating substrate; a common electrode which is formed on the insulating substrate; a pixel electrode which is formed between the insulating substrate and the common electrode; a plurality of common voltage applying layers which are formed between the insulating substrate and the common electrode, and are separated from one another so that the pixel electrode is interposed therebetween; an organic insulating layer formed between the insulating substrate and the common electrode and which has a contact hole that exposes each common voltage applying layer in a lengthwise direction. A layering preventing column contacts part of the exposed area of the common voltage applying layers that are exposed through the contact hole. The layering preventing column comprises a lower surface and an upper surface. The upper surface has a larger area than the lower surface. The common electrode electrically is connected to the exposed area of the common voltage applying layers which is exposed through the contact hole.

The common voltage applying layers may be formed as the same layer as the pixel electrode.

The display device may comprise a sub common voltage applying layer which is positioned between the common voltage applying layers and the insulating substrate, and is electrically connected with the common voltage applying layers, wherein a common voltage may be applied to at least one of the common voltage applying layers and the sub common voltage applying layer.

The display device may comprise a plurality of organic layers which are formed between the pixel electrode and the common electrode, wherein at least one of the plurality of organic layers may be formed on the upper surface of the layering preventing column.

The foregoing and/or other aspects of the present invention can be achieved by providing a manufacturing process of a display device, comprising: forming a common voltage applying layer on an insulating substrate; forming an organic insulating layer on the insulating substrate to form a contact hole through which at least a part of a side surface of the common voltage applying layer is exposed; and forming a common electrode which is electrically connected to a side surface contact portion of the common voltage applying layer through the contact hole.

The manufacturing process of the display device may comprise forming a pixel electrode between the insulating substrate and the common electrode, wherein the common voltage applying layer may be formed as the same layer as the pixel electrode.

The manufacturing process of the display device may comprise forming a subs common voltage applying layer which is positioned between the insulating substrate and the common voltage applying layer, and is electrically connected with the common voltage applying layer before the forming the common voltage applying layer.

The manufacturing process of the display device may comprise forming an organic layer between the forming organic insulating layer and the forming the common electrode, wherein the organic layer is formed by using an open mask.

The forming the organic insulating layer may comprise forming the contact hole to form a distanced area so that at least a part of a side surface of the common voltage applying layer can be distanced from the organic insulating layer, the manufacturing process of the display device further may comprise forming the organic layer on the distanced area between the forming the organic insulating layer and the forming the common electrode, and the organic layer may have a smaller thickness than the common voltage applying layer.

The manufacturing process of the display device may comprise forming to the contact hole a layering preventing column which exposes at least a part of an upper surface of the common voltage applying layer, contacts with the exposed part of the upper surface of the common voltage applying layer, and comprises a lower surface which contacts with the common voltage applying layer and an upper surface which has a bigger area than the lower surface.

The forming the common voltage applying layer may comprise forming the common voltage applying layer so that the common voltage applying layer is multi layers, and an upper layer of the common voltage applying layer has a bigger area than a lower layer thereof.

The forming the common voltage applying layer may comprise forming the common voltage applying layer so that the common voltage applying layer is a single layer, and an upper surface of the common voltage applying layer has a bigger area than a lower surface thereof.

BRIEF DESCRIPTION OF THE DRAWINGS

These and/or other aspects of the present invention will become apparent and more readily appreciated from the following description of the exemplary embodiments, taken in conjunction with the accompanying drawings, in which.

DETAILED DESCRIPTION

The present invention is exemplarily described to be applied to an organic light emitting diode display device among a display device. Alternatively, the present invention may be applied to other devices using an open mask to form a substance.

Figure 1:
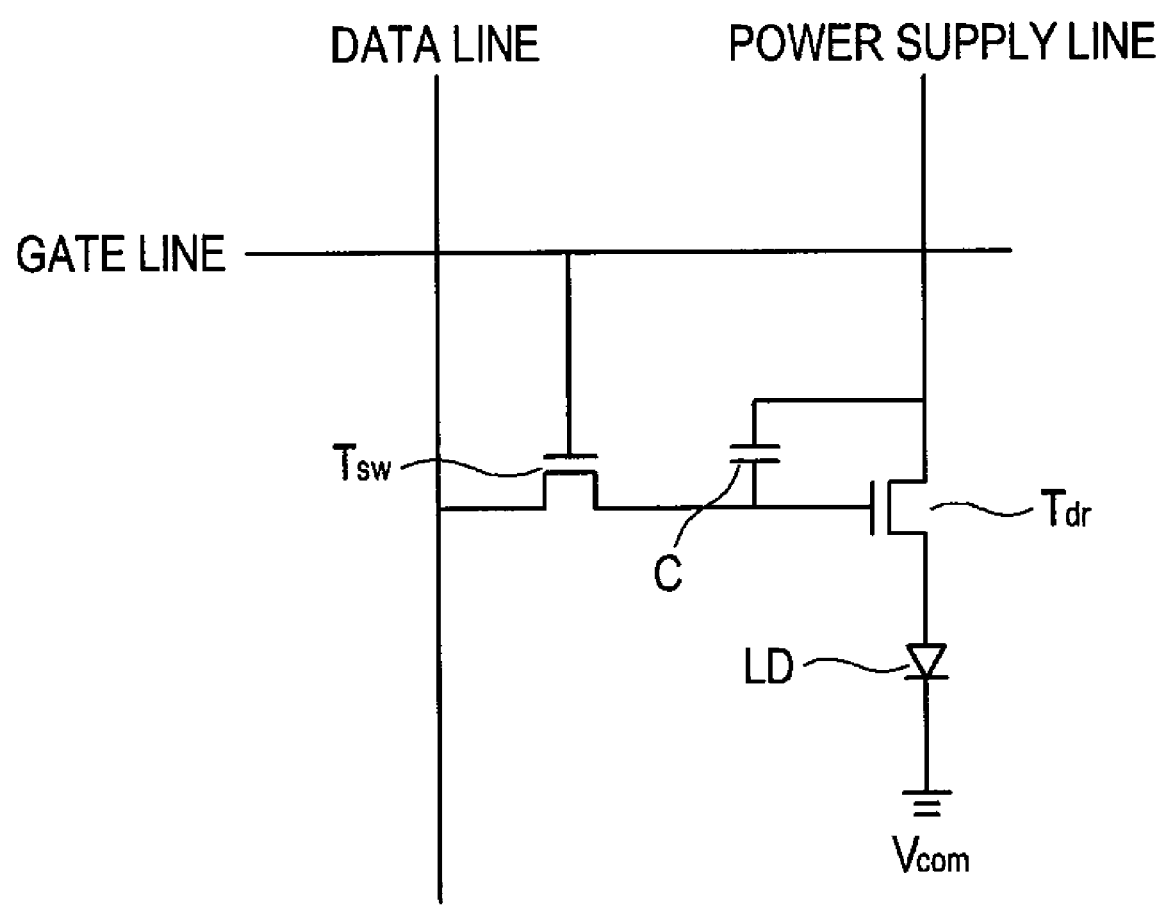
FIG. 1 is an equivalent circuit diagram of a display device according to a first exemplary embodiment of the present invention.

FIG. 1 is an equivalent circuit diagram illustrating of a pixel of a display device according to a first exemplary embodiment of the present invention.

As shown therein, a single pixel is provided with a plurality of signal lines. The signal lines include a gate line transmitting a scanning signal, a data line transmitting a data signal, and a power supply line transmitting a driving voltage. The data line and the power supply line may be parallel to and adjacent to each other. The gate line extends to perpendicularly traverse the data line and the power supply line.

Each pixel includes an organic light emitting element LD, a switching thin film transistor Tsw, a driving thin film transistor Tdr and a capacitor C.

The driving thin film transistor Tdr includes a control terminal, an input terminal and an output terminal. The control terminal is connected to the switching thin film transistor Tsw, the input terminal is connected to the power supply line, and the output terminal is connected to the organic light emitting element LD.

The organic light emitting element LD includes an anode connected to the output terminal of the driving thin film transistor Tdr, and a cathode to which a common voltage is applied. The organic light emitting element LD emits a light having intensity varying depending on the output current of the driving thin film transistor Tdr to display an image. The amount of current provided by the driving thin film transistor Tdr varies depending on a voltage applied between the control terminal and the output terminal.

The switching thin film transistor Tsw includes a control terminal, an input terminal and an output terminal. The control terminal is connected to the gate line, the input terminal is connected to the data line, and the output terminal is connected to the control terminal of the driving thin film transistor Tdr. The switching thin film transistor Tsw transmits the data signal applied to the data line to the driving thin film transistor Tdr depending on the scanning signal applied to the gate line.

The capacitor C is connected between the control terminal and the input terminal of the driving thin film transistor Tdr. The capacitor C is charged with the data signal inputted to control terminal of the driving thin film transistor Tdr, and maintains the charged data signal.

Hereinafter, a display device according to a first exemplary embodiment of the present invention will be described by referring to FIGS. 2 to 8.

As shown therein, the display device according to the first exemplary embodiment of the present invention includes an insulating substrate 11, a common electrode 99 formed on the insulating substrate 11, a common voltage applying layer 100 formed between the insulating substrate 11 and the common electrode 99, and an organic insulating layer 80 formed between the insulating substrate 11 and the common electrode 99 and formed with a contact hole 82 which exposes at least a part of a side surface of the common voltage applying layer 100 to contact with the common electrode 99.

Figure 2:
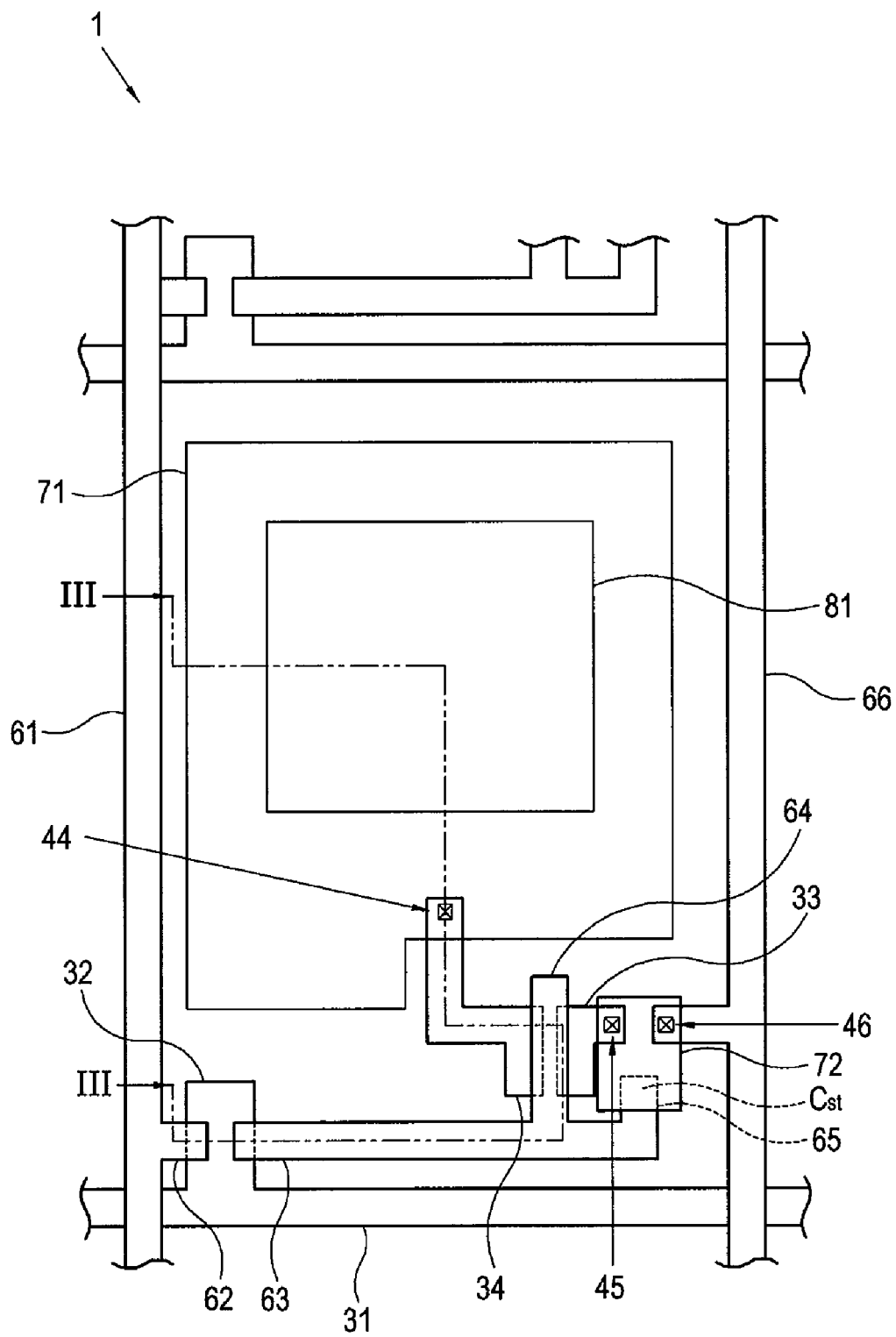
FIG. 2 is a plane view of the display device according to the first exemplary embodiment of the present invention.
Figure 3A:
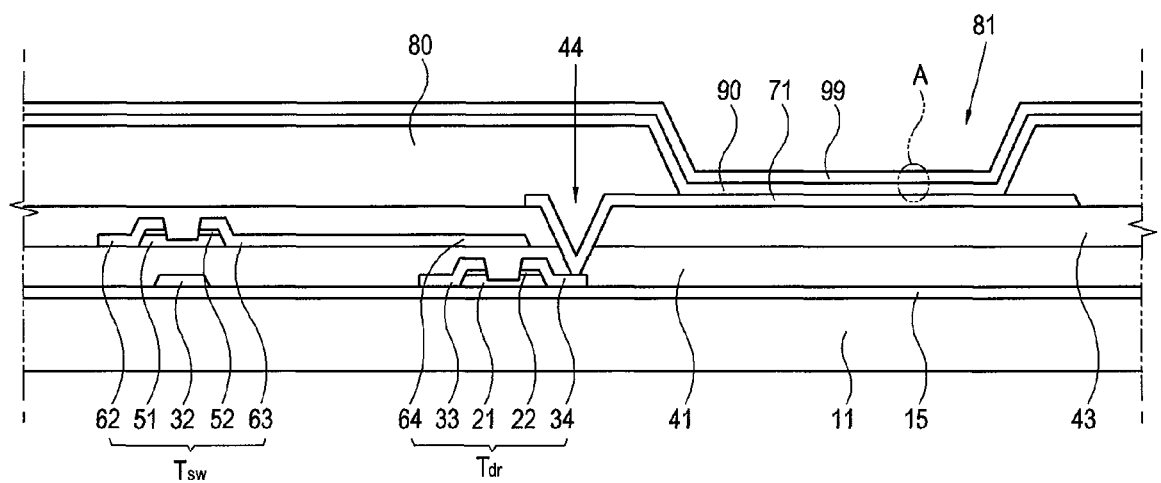
FIG. 3A is a sectional view taken along line III-III in FIG. 2.
Figure 3B:
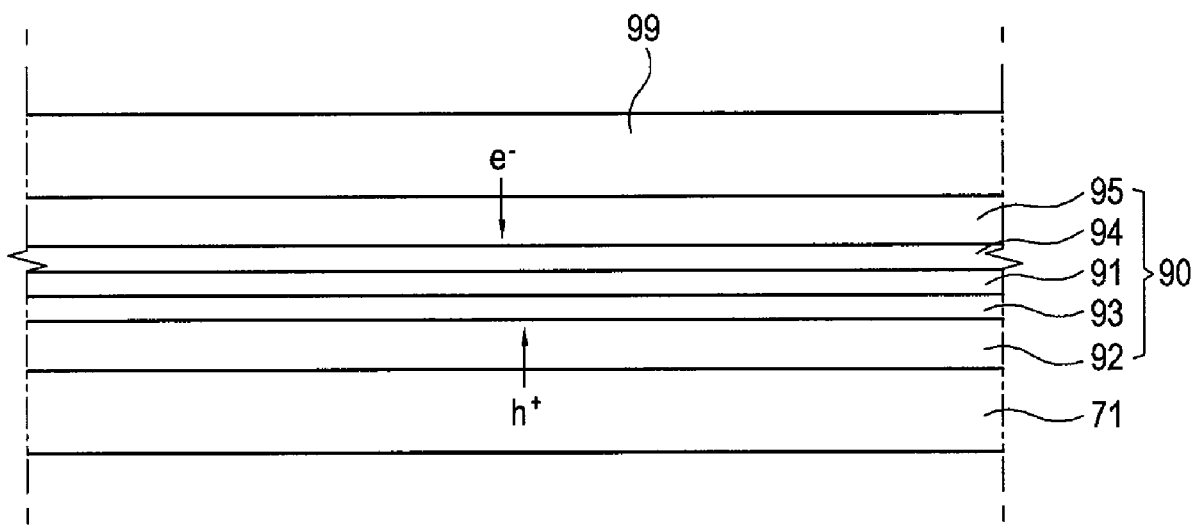
FIG. 3B is an enlarged view illustrating portion 'A' in FIG. 3A.

As shown in FIGS. 2, 3A and 3B, a buffer layer 15 is formed on the insulating substrate 11. The buffer layer 15 may be formed of silicon oxide, and prevents impurities of the insulating substrate 11 from entering an amorphous silicon layer in a crystallizing process of the amorphous silicon layer.

A driving semiconductor layer 21 and a driving ohmic contact layer 22 are formed on the buffer layer 15. The driving semiconductor layer 21 and the driving ohmic contact layer 22 are formed of polysilicon.

The driving semiconductor layer 21 and the driving ohmic contact layer 22 may be manufactured by forming an amorphous silicon layer and an amorphous ohmic contact layer on the buffer layer 15, and then crystallizing and patterning these. In the crystallizing process thereof, a solid phase crystallization method may be employed.

A first metal layer is formed on the buffer layer 15, the driving semiconductor layer 21 and the driving ohmic contact layer 22.

The first metal layer includes a gate line 31, a switching gate electrode 32, a driving source electrode 33 and a driving drain electrode 34. The gate line 31 and the switching gate electrode 32 are integrally formed.

A first insulating layer 41 is formed on the first metal layer. The first insulating layer 41 may be formed of silicon nitride.

A switching semiconductor layer 51 and a switching ohmic contact layer 52 are formed on the first insulating layer 41. The switching semiconductor layer 51 and the switching ohmic contact layer 52 correspond to the switching gate electrode 32, and may be formed of amorphous silicon.

A second metal layer is formed on the first insulating layer 41, the switching semiconductor layer 51 and the switching ohmic contact layer 52.

The second metal layer includes a data line 61, a switching source electrode 62, a switching drain electrode 63, a driving gate electrode 64, a storage capacity line 65 and a power supply line 66.

The data line 61 and the switching source electrode 62 are integral. The switching drain electrode 63, the driving gate electrode 64 and the storage capacity line 65 are integrally formed.

A second insulating layer 43 is formed on the second metal layer. The second insulating layer 43 is named as a planarization layer, and may include an organic material. One of benzocyclobutene (BCB) series, olefin series, acrylic resin series, polyimide series, and fluororesin may be used for the organic material.

Contact holes 44, 45 and 46 are formed in the second insulating layer 43. An electrode contact hole 44 exposes the driving drain electrode 34, an electrode contact hole 45 exposes the driving source electrode 33, and a contact hole 46 exposes the power supply line 66. The first insulating layer 41 is also removed in the electrode contact holes 44 and 45.

A pixel electrode 71 and a bridge electrode 72 are formed on the second insulating layer 43. The pixel electrode 71 is an anode electrode which is electrically connected to the driving drain electrode 34 through the electrode contact hole 44 to supply a hole to an organic layer 90. In a top emission type display device, an opaque reflection metal and metal having a high work function value smoothing a hole injection are used for the pixel electrode 71. That is, the pixel electrode 71 according to the present exemplary embodiment of the present invention may be formed of double layers of aluminum and indium zinc oxide (IZO). Alternatively, the pixel electrode 71 may be formed of nickel, chrome, indium tin oxide (ITO), etc.

The bridge electrode 72 electrically connects the switching source electrode 33 and the power supply line 66 through the contact holes 45 and 46. The storage capacity line 65 extends below the bridge electrode 72 to form a storage capacity Cst.

The organic insulating layer 80 is formed on the second insulating layer 43. The organic insulating layer 80 divides between the pixel electrodes 71 and has a removed part to form an opening portion 81 exposing the pixel electrode 71. Also, the organic insulating layer 80 is formed with a contact hole 82 to expose the common voltage applying layer 100.

The organic insulating layer 80 is formed of an organic material. The organic insulating layer 80 is named as a wall, and has a smaller dielectric constant than an inorganic insulating layer.

The organic layer 90 is formed on the pixel electrode 71 exposed by the organic insulating layer 80 and the opening portion 81.

The organic layer 90 advantageously includes an emitting material layer (EML) 91 emitting a light, a hole injection layer (HIL) 92 and a hole transfer layer (HTL) 93 provided between the emitting material layer 91 and the pixel electrode 71, an electron injection layer (EIL) 95 and an electron transfer layer (ETL) 94 provided between the emitting material layer 91 and the common electrode 99. However, the organic layer may comprise at least one of the emitting material layer 91, the hole injection layer 92, the hole transfer layer 93, the electron injection layer 95 and the electron transfer layer 94. The organic layer 90 except the emitting material layer 91 is formed on the organic insulating layer 80 and on the common voltage applying layer 100 exposed by the contact hole 82.

An area in which the pixel electrode 71 and the organic layer 90 directly contact to each other refers to a pixel area. The pixel area according to the present exemplary embodiment of the present invention substantially corresponds to an area of the opening portion 81, and light is mainly generated in the pixel area.

The common electrode 99 is formed on the organic insulating layer 80 and the organic layer 90. In a top emission type display device, the common electrode 99 may be formed of a transparent conductive material such as ITO or IZO, or may be formed to be translucent by thinly laminating a metal such as nickel or chrome. Also, the common electrode 99 may be formed as multi layers by variously mixing metal such as ITO or IZO, nickel or chrome, etc. The common electrode 99 is employed as a cathode electrode supplying electrons to the emitting material layer 91.

After a hole transmitted from the pixel electrode 71 and an electron transmitted from the common electrode 99 are combined to become an exciton, light is generated in the deactivating process of the exciton. In a top emission type display device, light proceeding toward the pixel electrode 71 is reflected and proceeds toward the common electrode 99, and is emitted to the outside through the common electrode 99.

The emitting material layer 91 is formed of different materials emitting red, green and blue lights by each pixel on the pixel electrode 71. In forming the emitting material layer 91, a shadow mask is used to separate the different materials by color to prevent a color mixture. In case of using the shadow mask, material such as the emitting material layer 91 can be formed to a necessary position to be prevented from being formed on the common voltage applying layer 100. However, it is necessary to align the shadow mask, and accordingly, a manufacturing process becomes complicated.

The organic layer 90 except the emitting material layer 91, that is, the hole injection layer 92, the hole transfer layer 93, the electron injection layer 95 and the electron transfer layer 94 may be formed by using an open mask in which a detailed pattern is not formed. In case of using the open mask, a manufacturing process is simple, and a manufacturing cost can be reduced in comparison to the case of using the shadow mask. However, the organic layer 90 except the emitting material layer 91 is formed on the common voltage applying layer 100 exposed by the contact hole 82 to disturb contact between the common voltage applying layer 100 and the common electrode 99.

The emitting material layer 91 may be provided to emit a white light, and a separate color filter is provided on the common electrode 99 to correspond to the red, green and blue colors. The emitting material layer emitting the white light may be formed by using the open mask instead of using the shadow mask. However, in this case, the emitting material layer 91 may be formed on the common voltage applying layer 100 exposed by the contact hole 82 to disturb the contact between the common voltage applying layer 100 and the common electrode 99.

Hereinafter, a contacting method of the common electrode 99 and the common voltage applying layer 100 in case of using the open mask will be described in detail by referring to FIGS. 4 to 7.

Figure 6A:
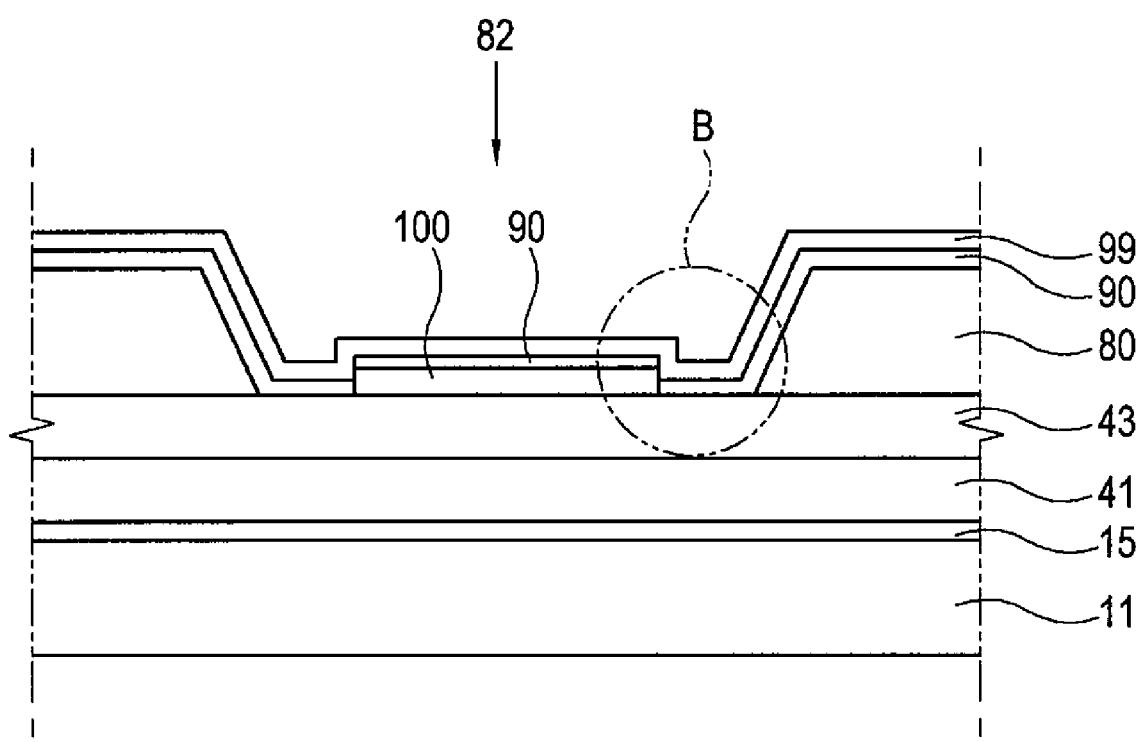
FIG. 6A is a sectional view taken along line VI-VI in FIGS. 4 and 5.

As shown in FIG. 6A, the buffer layer 15, the first insulating layer 41 and the second insulating layer 43 are formed on the insulating substrate 11. The common voltage applying layer 100 is formed of the same layer as the pixel electrode 71 on the second insulating layer 43. A plurality of organic layers 90 and the common electrode 99 are formed on the common voltage applying layer 100.

Figure 7:
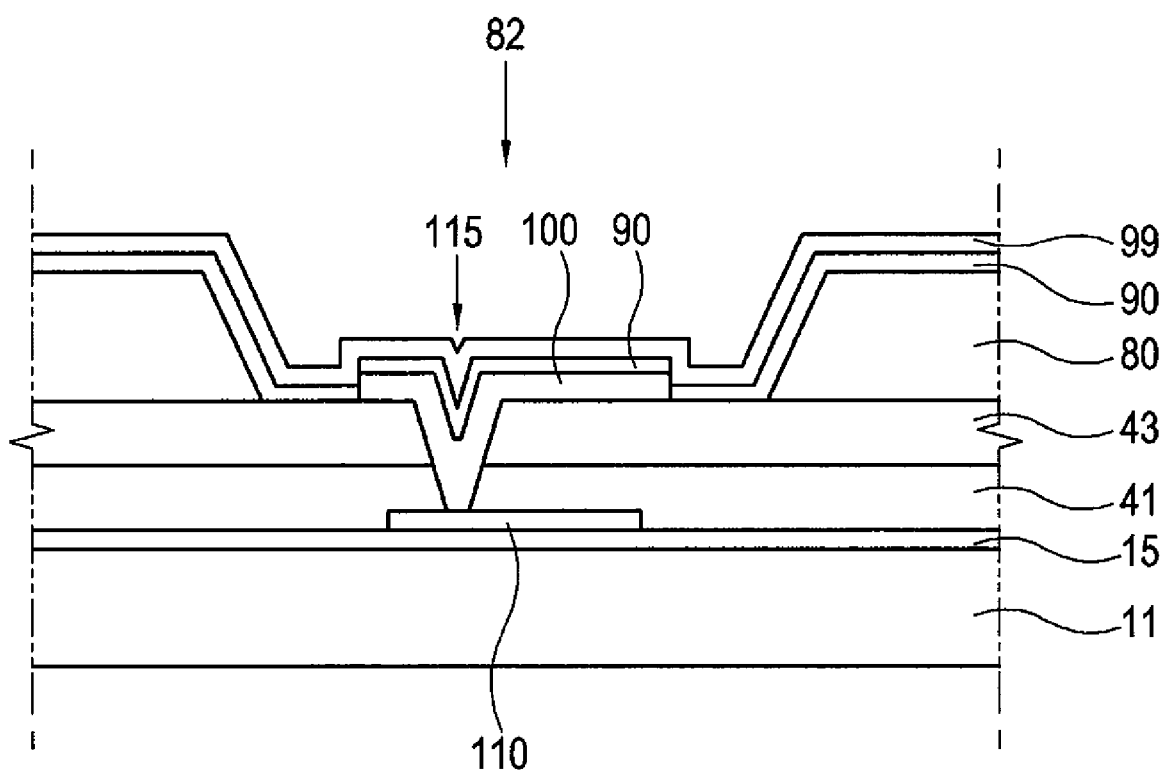
FIG. 7 is a sectional view adding a sub common voltage applying layer to the display device according to the first exemplary embodiment of the present invention.

A common voltage is applied to the common voltage applying layer 100 to apply the common voltage to the common electrode 99. That is, the common voltage applying layer 100 according to the present exemplary embodiment of the present invention is applied with the common voltage from an end part in a lengthwise direction thereof. Alternatively, as shown in FIG. 7, the common voltage applying layer 100 may be applied with the common voltage through a sub common voltage applying layer 110.

The common voltage applying layer 100 according to the present exemplary embodiment of the present invention is formed in the same layer as the pixel electrode 71. In this case, the contact hole 82 is formed to the organic insulating layer 80. Alternatively, the common voltage applying layer 100 may be formed of a separate metal layer on the insulating substrate 11 and the pixel electrode 71. For example, the common voltage applying layer 100 may be formed of the same layer as at least one of the first metal layer and the second metal layer forming the switching thin film transistor Tsw and the driving thin film transistor Tdr. In this case, the contact hole 82 may be formed to the first insulating layer 41, the second insulating layer 43 and the organic insulating layer 80.

The common voltage applying layer 100 is formed of double layers of aluminum and indium zinc oxide (IZO) which are the same materials as the pixel electrode 71. The common voltage applying layer 100 and the pixel electrode 71 are formed by the same process. Alternatively, the common voltage applying layer 100 may be formed of a single layer, or more than three layers.

The common voltage applying layer 100 includes an upper surface facing the common electrode 99, a lower surface facing the insulating substrate 11, and a side surface of the opposite sides of the upper surface and the lower surface. A side surface contact portion 105 exposed by the contact hole 82 of the organic insulating layer 80 to be electrically connected with the common electrode 99 is provided to the side surface of the common voltage applying layer 100. On the common voltage applying layer 100 exposed by the contact hole 82, the organic layer 90 is formed by using the open mask.

Figure 6B:
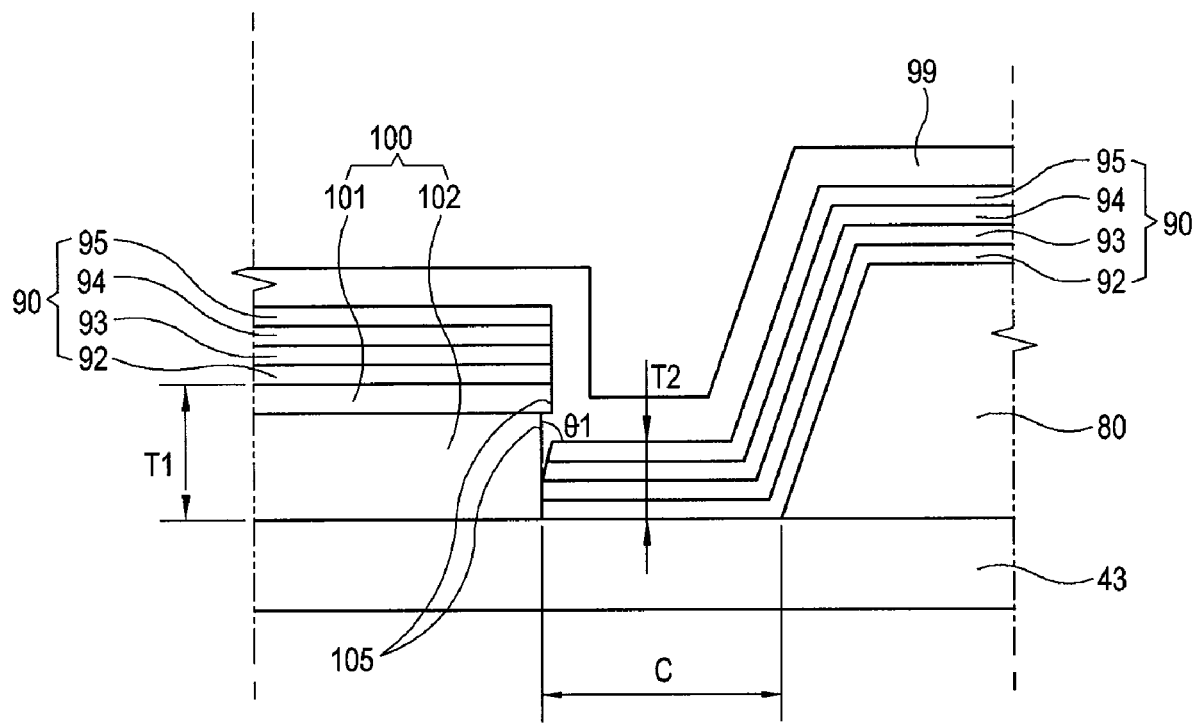
FIG. 6B is an enlarged view illustrating portion 'B' in FIG. 6A.

As shown in FIG. 6B, the common voltage applying layer 100 according to the present exemplary embodiment of the present invention is provided as double layers, and an upper layer 101 of the common voltage applying layer 100 has a bigger area than a lower layer 102 thereof.

An outer angle $\theta 1$ between the side surface of the common voltage applying layer 100 and a surface of the insulating substrate 11 is equal to or less than 90 degree. That is, the side surface of the common voltage applying layer 100 may be perpendicular to the surface of the insulating substrate 11, or an upper part of the side surface of the common voltage applying layer 100 may have a protruding shape in comparison to a lower part thereof. According to the present exemplary embodiment of the present invention, the lower layer 102 of the common voltage applying layer 100 is formed of aluminum, and the upper layer 101 thereof is formed of indium zinc oxide (IZO). In this case, the organic layer 90 may be deposited by means of a method like a thermal evaporation which does not spread organic material in all directions but spread organic material in limited directions. Accordingly, the "overhang" of layer 101 prevents organic layer 90 from being deposited on the side surface of the common voltage applying layer 100. Alternatively, the outer angle θ1 between the side surface of the common voltage applying layer 100 and the surface of the insulating substrate 11 may be determined to be less than 110 degree to prevent the organic layer 90 from being formed on the side surface of the common voltage applying layer 100.

The thickness T1 of the common voltage applying layer 100 is approximately 3000 Å. Alternatively, the thickness T1 of the common voltage applying layer 100 may be approximately 2000 Å to 4000 Å.

The contact hole 82 is formed to have a distanced area C in which at least a part of the side surface of the common voltage applying layer 100 is distanced from the organic insulating layer 80. The organic layer 90 formed on the distanced area C is formed to have a smaller thickness T2 than the thickness T1 of the common voltage applying layer 100. According to the present exemplary embodiment of the present invention, the organic layer 90 formed on the distanced area C of the contact hole 82 includes the hole injection layer 92, the hole transfer layer 93, the electron injection layer 95 and the electron transfer layer 94 except the emitting material layer 91, and the thickness T2 of these is approximately 2000 Å which is smaller than the common voltage applying layer 100. Alternatively, the thickness T2 of the organic layer 90 formed on the distanced area C may be approximately 50% to 80% of the thickness T1 of the common voltage applying layer 100, or may be smaller than the thickness of the common voltage applying layer 100 by approximately 1000 Å to 2000 Å.

As shown in FIG. 6B, since the organic layer 90 formed on the distanced area C is formed by thermal evaporation under the condition of the upper layer 101 of the common voltage applying layer 100 being further protruded than the lower layer 102 thereof, the area of contact between portions of the organic layer 90, such as the electron injection layer 95 and the electron transfer layer 94 and the side surface of the common voltage applying layer 100, can be reduced. Accordingly, the side surface contact portion 105 of the common voltage applying layer 100 contacting with the common electrode 99 can be further widened.

Alternatively, the organic layer 90 deposited on the distanced area C of the contact hole 82 may include an emitting material layer emitting a white light, and the thickness of the organic layer 90 may be smaller than the thickness of the common voltage applying layer 100 as described above.

Figure 4:
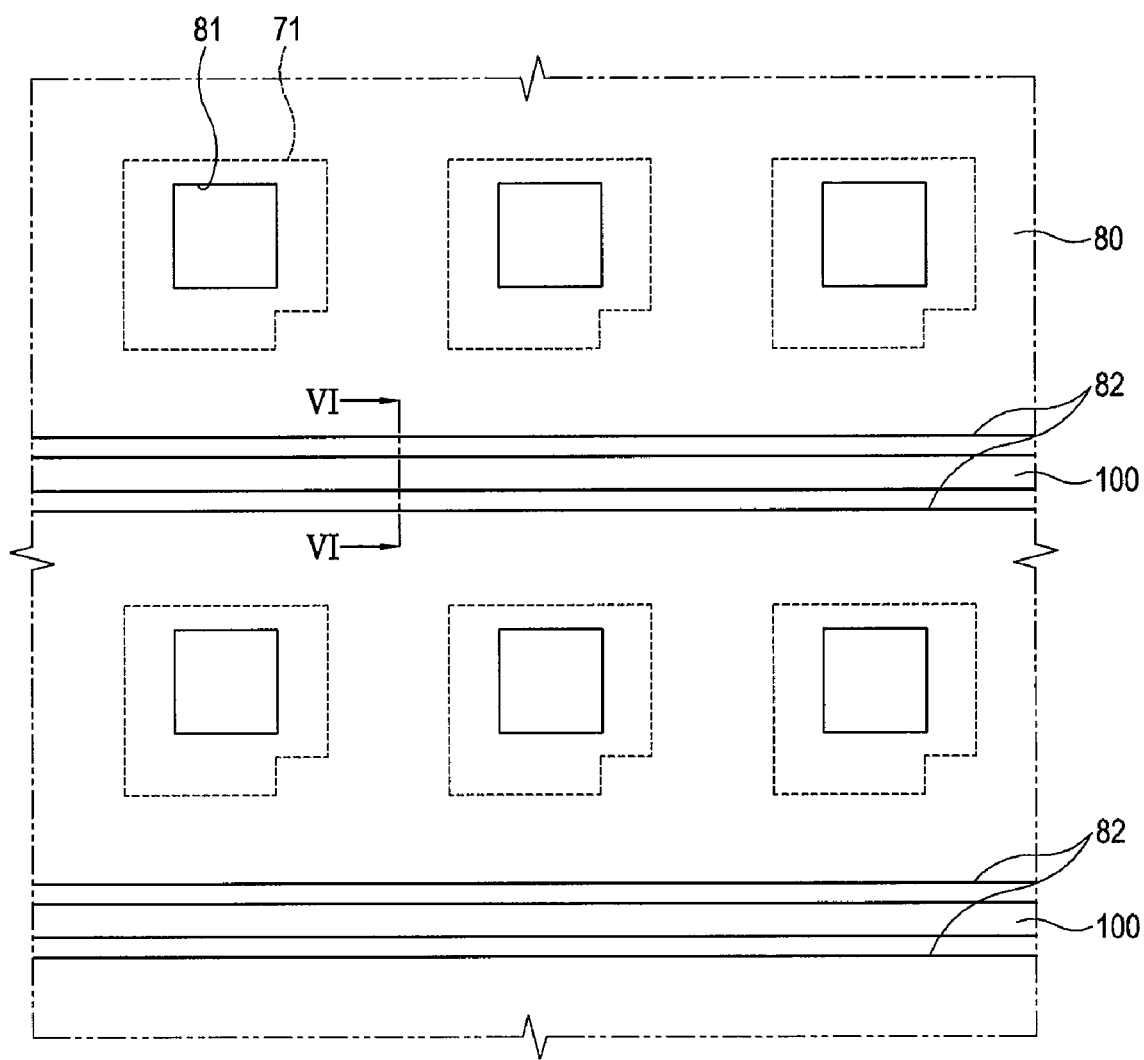
FIG. 4 is a schematic plane view of the display device according to the first exemplary embodiment of the present invention.
Figure 5:
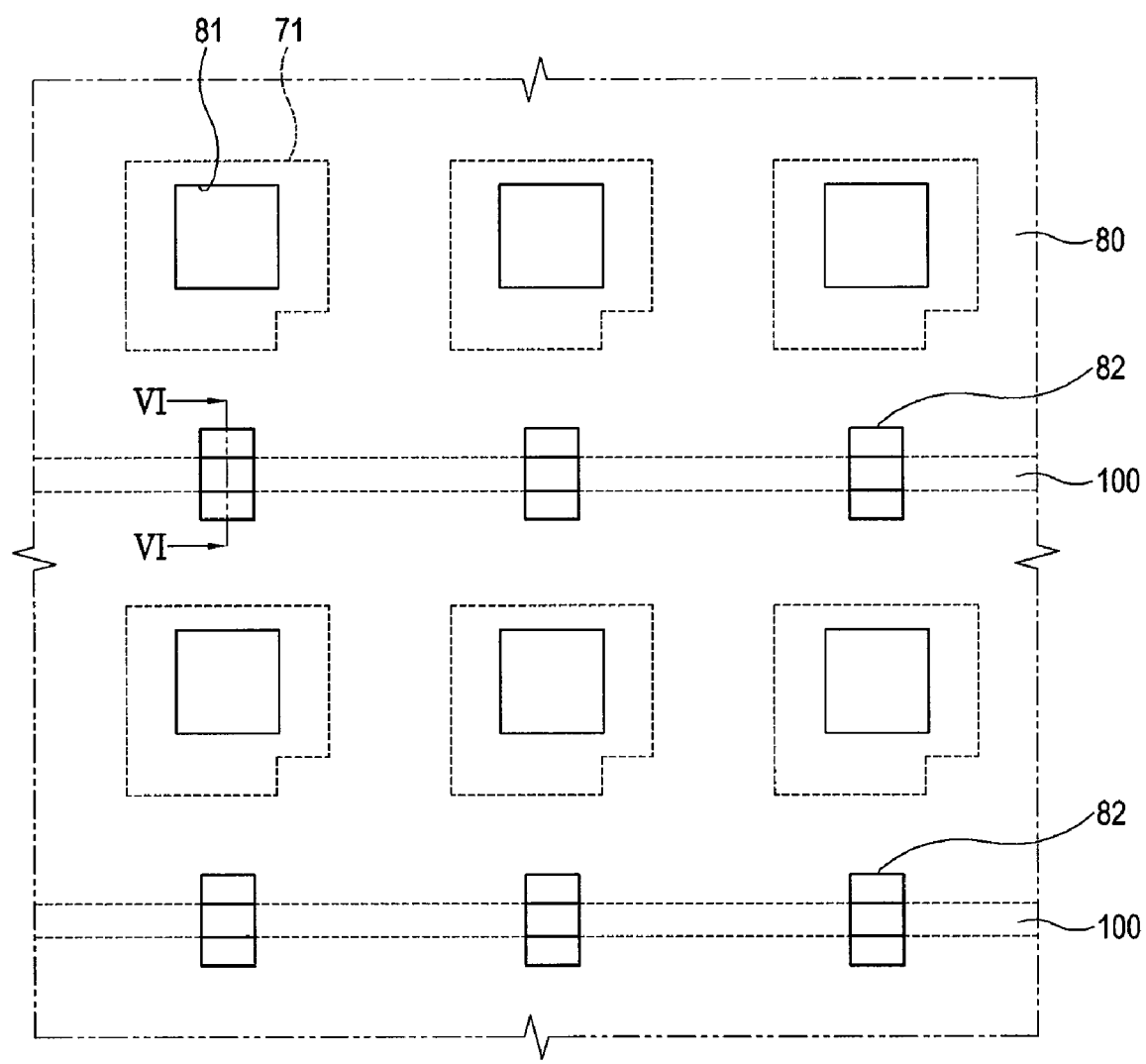
FIG. 5 is a plane view varying a shape of a contact hole in FIG. 4.

As shown in FIG. 4, the side surface contact portion 105 is exposed by the contact hole 82 and elongated in a lengthwise direction of the common voltage applying layer 100. Accordingly, since the common electrode 99 continuously contacts along the side surface contact portion 105 to widen a contact area, the common voltage supplied to the common voltage applying layer 100 can be stably applied to the common electrode 99. Alternatively, as shown in FIG. 5, the side surface contact portion 105 may be provided in plural to be distanced in the lengthwise direction of the common voltage applying layer 100. Accordingly, the common electrode 99 can contact to the plurality of side surface contact portions 105 so that the common voltage can be stably applied to the common electrode 99.

As shown in FIG. 6B, the side surface contact portion 105 of common voltage applying layer 100 makes contacts with the common electrode 99 above the organic layer 90 in the distanced area C. Accordingly, the common electrode 99 can easily contact with the common voltage applying layer 100 even when forming the organic layer 90 by using an open mask.

FIG. 7 illustrates a case in which the sub common voltage applying layer 110 is further provided. The sub common voltage applying layer 110 is provided between the common voltage applying layer 110 and the insulating substrate 11, and is electrically connected with the common voltage applying layer 100 through a contact hole 115. The subs common voltage applying layer 110 according to the present exemplary embodiment of the present invention is formed in the same layer as the first metal layer formed with the switching gate electrode 32. Alternatively, the sub common voltage applying layer 110 may be formed in the same layer as the second metal layer provided between the first metal layer and the common voltage applying layer 100.

The contact hole 115 is formed by removing the first insulating layer 41 and the second insulating layer 43 to expose the sub common voltage applying layer 110.

The sub common voltage applying layer 110 applies the common voltage to the common voltage applying layer 100. The sub common voltage applying layer 110 according to the present exemplary embodiment of the present invention receives the common voltage from an end part in a lengthwise direction thereof, and supplies this to the common voltage applying layer 100. In this case, the common voltage applying layer 100 receives no separate common voltage. Alternatively, a separate common voltage may be applied to the common voltage applying layer 100 as described above. The common voltage may be applied to at least one of the common voltage applying layer 100 and the sub common voltage applying layer 110.

If the sub common voltage applying layer 110 is provided, the common voltage applying layer 100 may be formed to be elongated in the lengthwise direction to contact with the sub common voltage applying layer 110, and may be provided in plural in the lengthwise direction to contact with the sub common voltage applying layer 110.

Hereinafter, a manufacturing method of the display device according to the first exemplary embodiment of the present invention will be described by referring to FIGS. 8A to 8C.

Figure 8A:
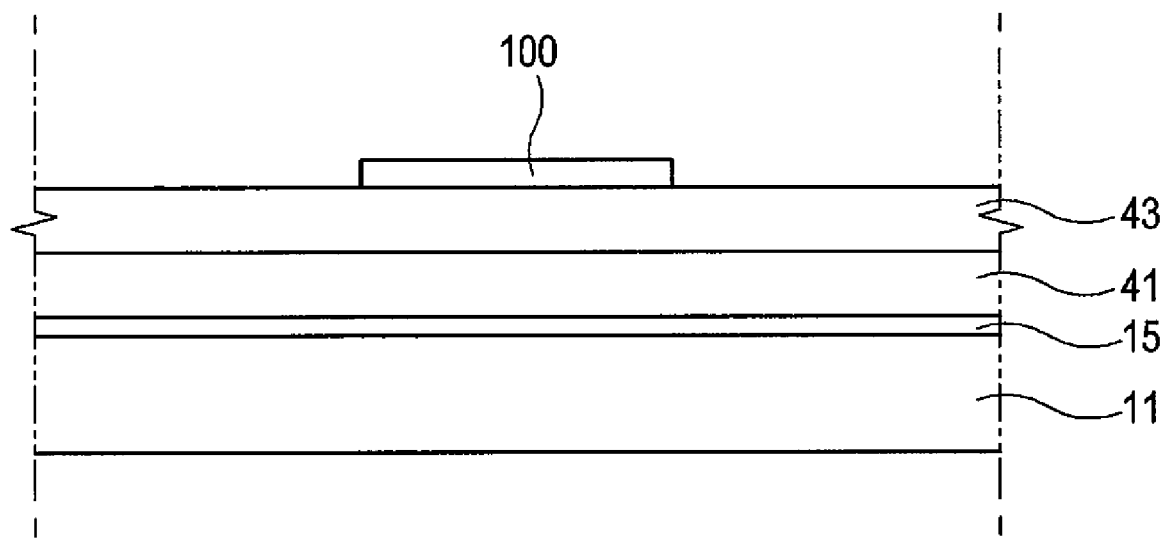
FIGS. 8A to 8C are sectional views illustrating a manufacturing method of the display device according to the first exemplary embodiment of the present invention.

As shown in FIG. 8A, the buffer layer 15, the first insulating layer 41 and the second insulating layer 43 are formed on the insulating substrate 11. The common voltage applying layer 100 is formed on the second insulating layer 43. Here, the common voltage applying layer 100 is formed as the same layer as the pixel electrode 71, and the pixel electrode 71 and the common voltage applying layer 100 may be formed by depositing metal and then patterning this. According to the present exemplary embodiment of the present invention, the common voltage applying layer 100 is formed to be double layers by depositing aluminum and indium zinc oxide (IZO) on the second insulating layer 43 in sequence by means of a sputtering method, and then performing a photolithography.

Here, the upper layer 101 formed of IZO can be further widened than the lower layer 102 formed of aluminum by using an etchant having a bigger etch rate against aluminum than IZO.

Figure 8B:
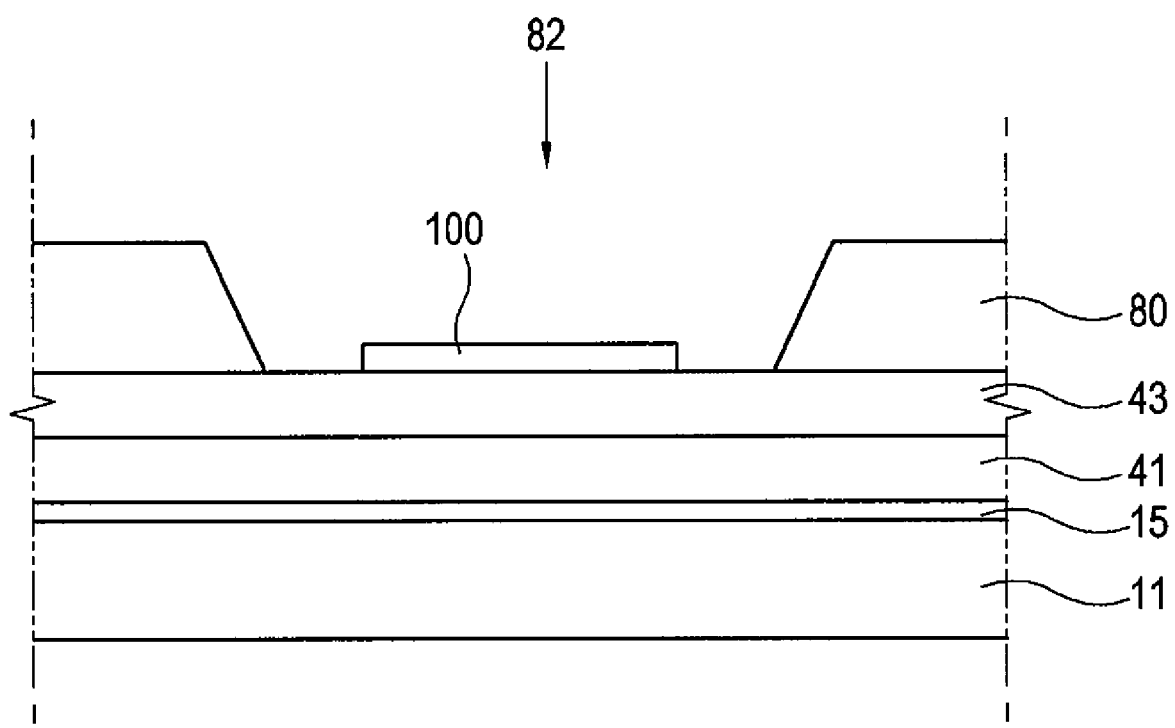

As shown in FIG. 8B, the organic insulating layer 80 having the contact hole 82 is formed on the second insulating layer 43. The organic insulating layer 80 according to the present exemplary embodiment of the present invention may be formed by coating, exposing and developing an organic material.

As shown in FIG. 4, the contact hole 82 is formed to be elongated in the lengthwise direction of the common voltage applying layer 100 so that the opposite sides of the common voltage applying layer 100 can be exposed. Alternatively, the contact hole 82 may be formed so that only one of the opposite sides of the common voltage applying layer 100 can be exposed. As shown in FIGS. 4 and 6B, the contact hole 82 is formed so that in distanced area C the side surfaces of the common voltage applying layer 100 and the organic insulating layer 80 are separated from each other. Alternatively, as shown in FIG. 5, the contact hole 82 may be provided in plural to be distanced in the lengthwise direction of the common voltage applying layer 100.

Figure 8C:
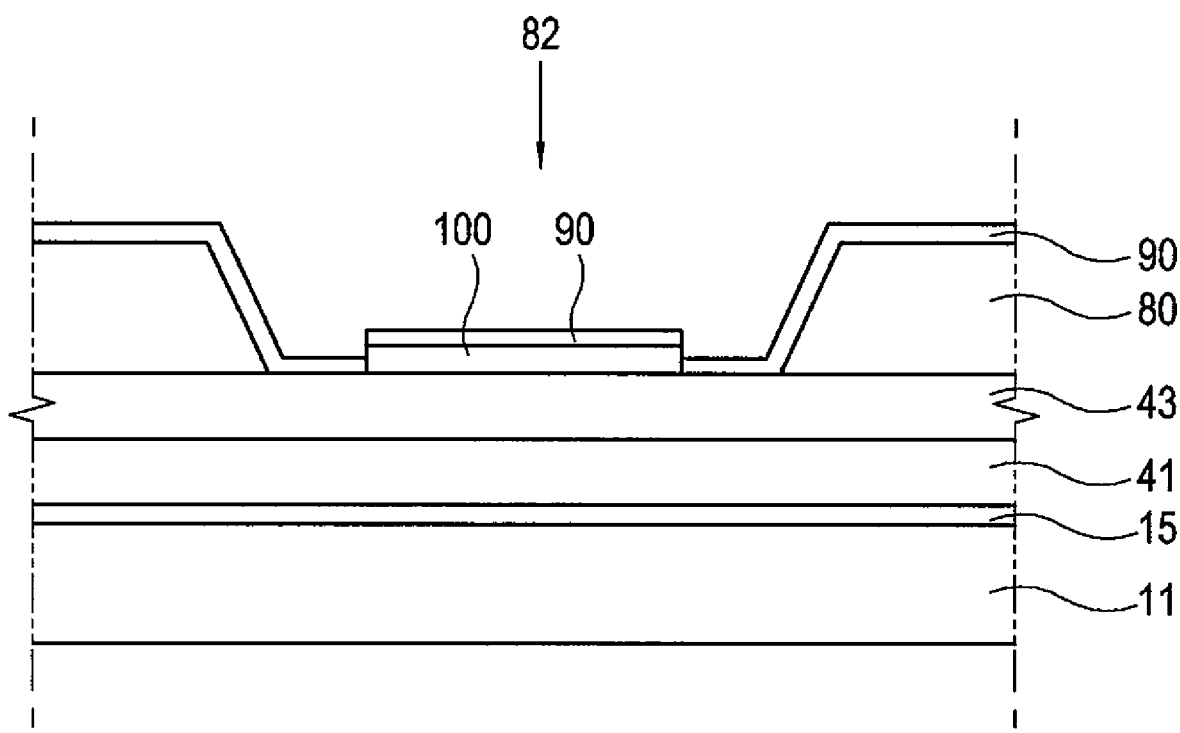

As shown in FIG. 8C, the organic layer 90 is formed on the organic insulating layer 80 and the common voltage applying layer 100. According to the present exemplary embodiment of the present invention, the plurality of organic layers 90 including no emitting material layer 91 are formed by means of the thermal evaporation by using the open mask. That is, the hole injection layer 92 and the hole transfer layer 93 are formed on the organic insulating layer 80, the opening portion 81 and the contact hole 82 by using the open mask, and then the emitting material layer 91 is formed to the opening portion 81 by using the shadow mask. Then, the electron transfer layer 94 and the electron injection layer 95 are formed on the organic insulating layer 80, the opening portion 81 and the contact hole 82 by using the open mask. Accordingly, the hole injection layer 92, the hole transfer layer 93, the electron transfer layer 94 and the electron injection layer 95 are formed on the common voltage applying layer 100, the distanced area C and the organic insulating layer 80 in sequence. The thickness of the organic layer 90 formed to the distanced area C is less than the thickness of the common voltage applying layer 100. Using thermal evaporation, the organic material forming the organic layer 90 is emitted in a perpendicular direction to the common voltage applying layer 100. Thus, in the distanced area C, the organic material is prevented from being formed upon an upper portion of the side surface contact portion 105 of the common voltage applying layer 100.

The hole injection layer 92, the hole transfer layer 93, the electron transfer layer 94 and the electron injection layer 95 may be employed for facilitating transference of holes and electrons to help the emitting material layer 91 emit light, but it is not necessary to employ all of them. The hole injection layer 92, the hole transfer layer 93, the electron transfer layer 94 and the electron injection layer 95 may be selectively provided.

Then, as shown in FIG. 6A, the common electrode 99 is formed on the organic layer 90. The common electrode 99 according to the present exemplary embodiment of the present invention may be formed of a transparent conductive material such as ITO or IZO, or may be formed to be translucent by laminating metal such as nickel or chrome to be thin. The common electrode 99 according to the present exemplary embodiment of the present invention is formed by the sputtering method which is one of a physical vapor deposition. Alternatively, the common electrode 99 may be formed by an atom layer chemical vapor deposition, the thermal evaporation, and other various known methods. In forming the common electrode 99 by using the sputtering method, the metal material forming the common electrode 99 has sputters in all directions and can easily be deposited upon the side surface contact portion 105 of the common voltage applying layer 100. However, in forming the common electrode 99 using the thermal evaporation, the metal material forming the common electrode 99 is emitted in a direction perpendicular to the common voltage applying layer 100 without spreading in all directions. Accordingly, the insulating substrate 11 should be inclined at a predetermined angle to deposit the metal material upon the side surfaces of contact portion 105 of the common voltage applying layer 100.

Accordingly, the display device according to the first exemplary embodiment of the present invention can electrically connect the common electrode 99 to the side surfaces of contact portion 105 of the common voltage applying layer 100 to apply an appropriate common voltage to the common electrode 99. Also, the display device according to the first exemplary embodiment of the present invention can easily connect the common electrode 99 to the side surfaces of contact portion 105 of the common voltage applying layer 100 in spite of forming the organic layer 90 upon an area in which the common voltage applying layer 100 is formed by using an open mask.

Figure 9:
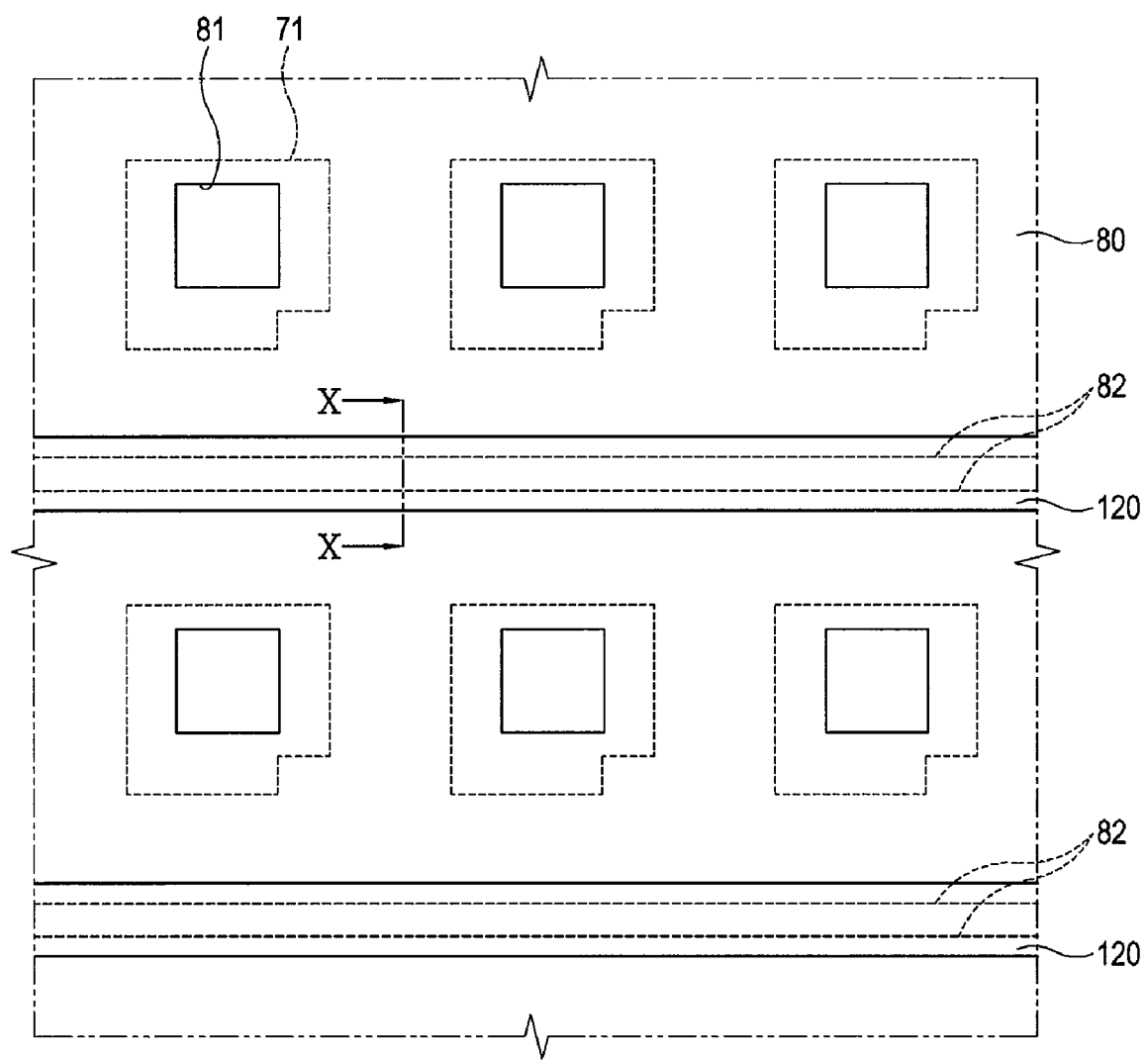
FIG. 9 is a schematic view of a display device according to a second exemplary embodiment of the present invention.
Figure 10:
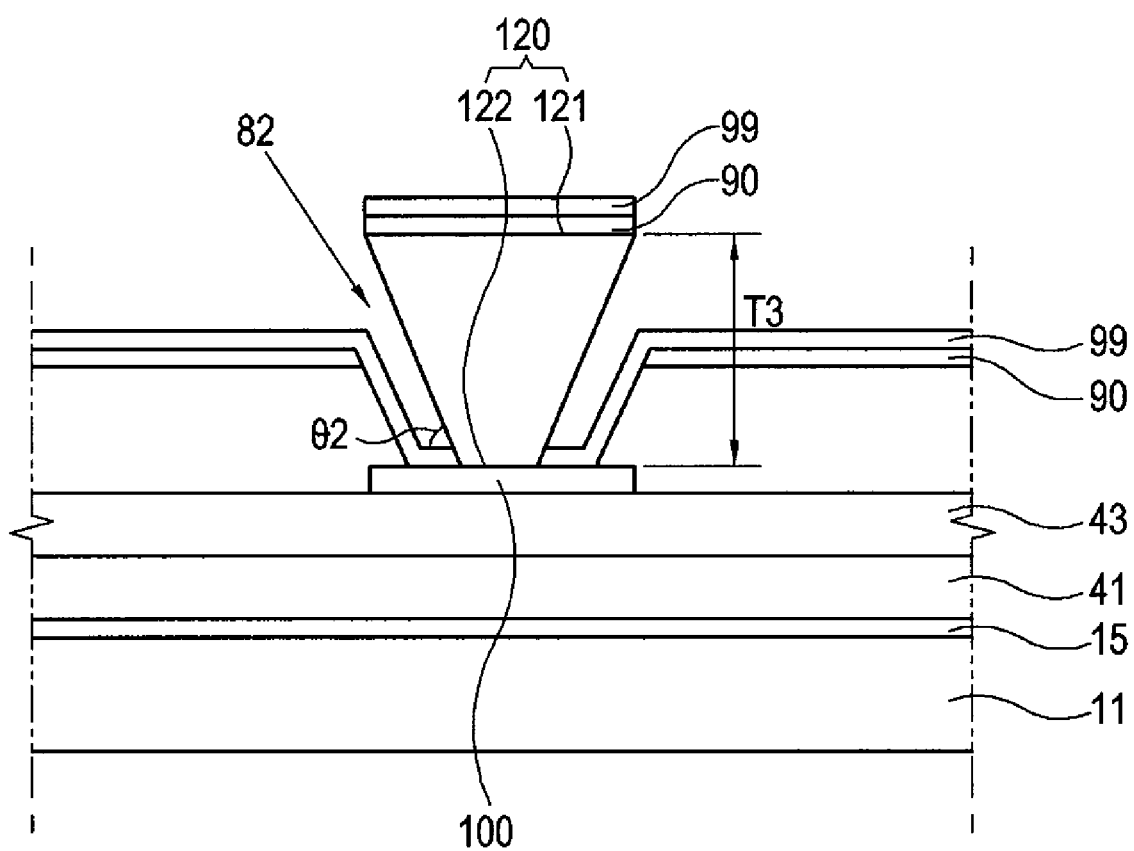
FIG. 10 is a sectional view taken along line X-X in FIG. 9.

FIGS. 9 and 10 are plane and sectional views schematically illustrating a display device according to a second exemplary embodiment of the present invention.

As shown therein, the display device according to the second exemplary embodiment of the present invention includes a plurality of common voltage applying layers 100 separated from one another by a pixel electrode 71. An organic insulating layer 80 is disposed between an insulating substrate 11 and a common electrode 99 and is formed with a contact hole 82. The contact hole 82 is formed in the lengthwise direction of each common voltage applying layer 100 to expose each common voltage applying layer 100. A layering preventing column 120 in contact hole 82 contacts part of an exposed area of the common voltage applying layer 100.

The contact hole 82 according to the second exemplary embodiment of the present invention is formed to the opposite side surfaces of the common voltage applying layer 100 to expose an area of an upper surface of the common voltage applying layer 100. Alternatively, the contact hole 82 may be formed so that a side surface of the common voltage applying layer 100 can be exposed like the first exemplary embodiment described above.

The layering preventing column 120 is formed on the common voltage applying layer 100 exposed through the contact hole 82 so that an area of an upper surface 121 can be bigger than an area of a lower surface 122. The height of the layering preventing column 120 may be 0.5~30 μm. The layering preventing column 120 according to the present exemplary embodiment of the present invention may be formed by a developing process of a negative photoresist material, a photoresist layer remaining on the insulating substrate 11 after developing may become the layering preventing column 120. Alternatively, the layering preventing column 120 may be formed as multi layers, and in this case, a lower layer contacting with the common voltage applying layer 100 is narrower than an upper layer. Alternatively, the layering preventing column 120 may be provided as a plurality of insulating layers having different etch rates, or multi layers including a metal layer and an insulating layer.

The layering preventing column 120 according to the present exemplary embodiment of the present invention has a sectional shape of a reverse trapezoid. The lower surface 122 of the layering preventing column 120 is narrower than the contact hole 82, and the upper surface 121 thereof is wider than the contact hole 82. Accordingly, the common voltage applying layer 100 exposed by the contact hole 82 is covered by the upper surface 121 of the layering preventing column 120.

An outer angle θ2 between a side surface of the layering preventing column 120 and a surface of the common voltage applying layer 100 is an acute angle. The outer angle θ2 varies depending on an area ratio of the common voltage applying layer 100 exposed by the lower surface 122, the upper surface 121 and the contact hole 82, and may be approximately 30 to 75 degree.

As described above, since the exposed area of the common voltage applying layer 100 is covered by the upper surface 121 of the layering preventing column 120, an organic layer 90 can be prevented from being layered on the common voltage applying layer 100 in case of forming the organic layer 90 by an open mask by means of a thermal evaporation. Also, since the open mask is used, the organic layer 90 is layered on an upper surface of the layering preventing column 120.

Accordingly, the common electrode 99 can be electrically connected to the common voltage applying layer 100 by depositing the common electrode 99 on the exposed area of the common voltage applying layer 100 in which the layering preventing column 120 is not formed by the same method as the first exemplary embodiment. Also, the common electrode 99 can easily contact to the exposed area of the common voltage applying layer 100 in which the layering preventing column 120 is not formed in spite of forming the organic layer 90 in an area in which the common voltage applying layer 100 is formed by using the open mask.

FIGS. 11 to 14 are plane and sectional views of a display device according to a third exemplary embodiment of the present invention.

As shown therein, in the third exemplary embodiment of the present invention, the layering preventing column 120 according to the second exemplary embodiment is combined to the configuration according to the first exemplary embodiment.

Figure 11:
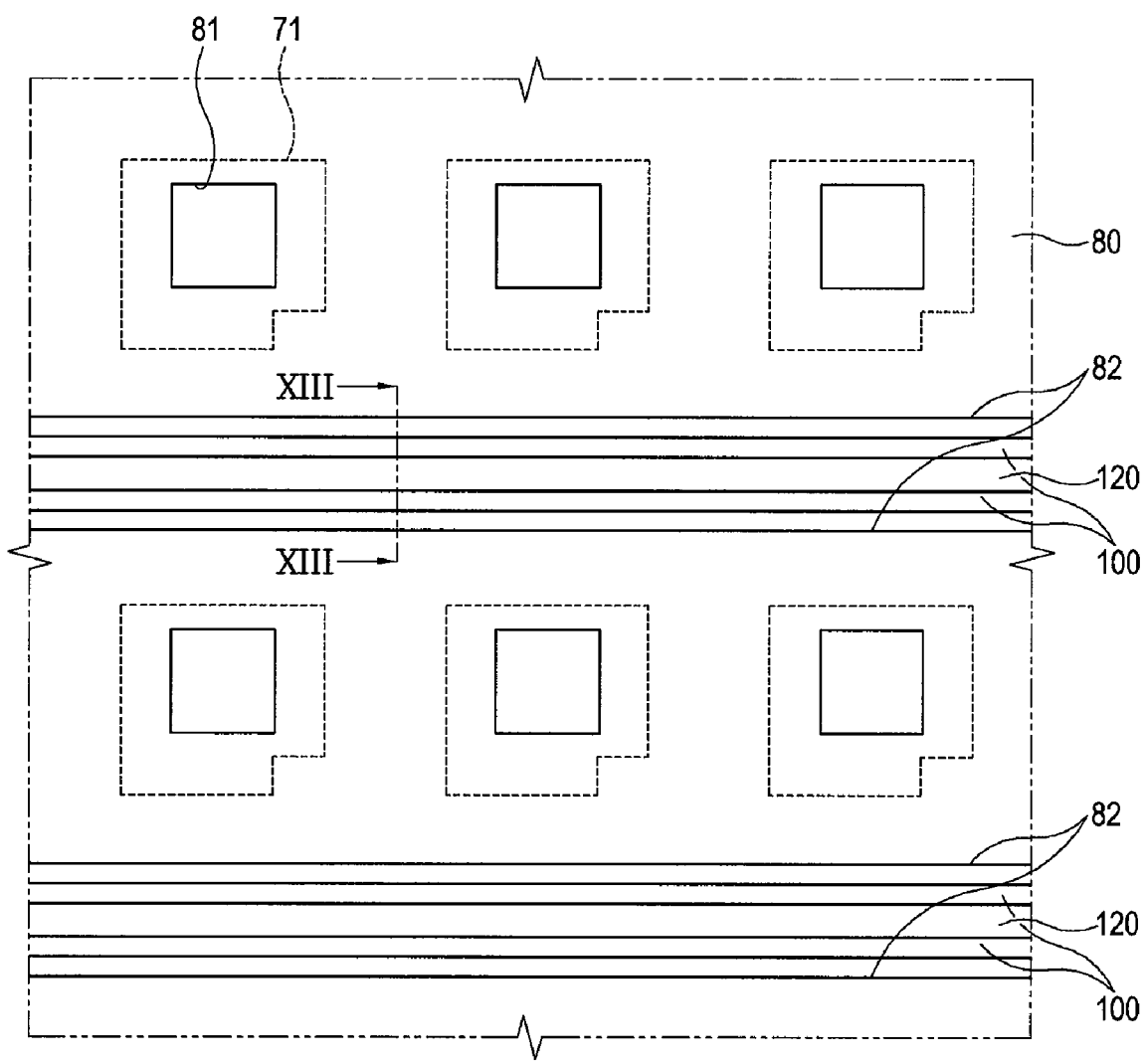
FIG. 11 is a schematic view of a display device according to a third exemplary embodiment of the present invention.
Figure 12:
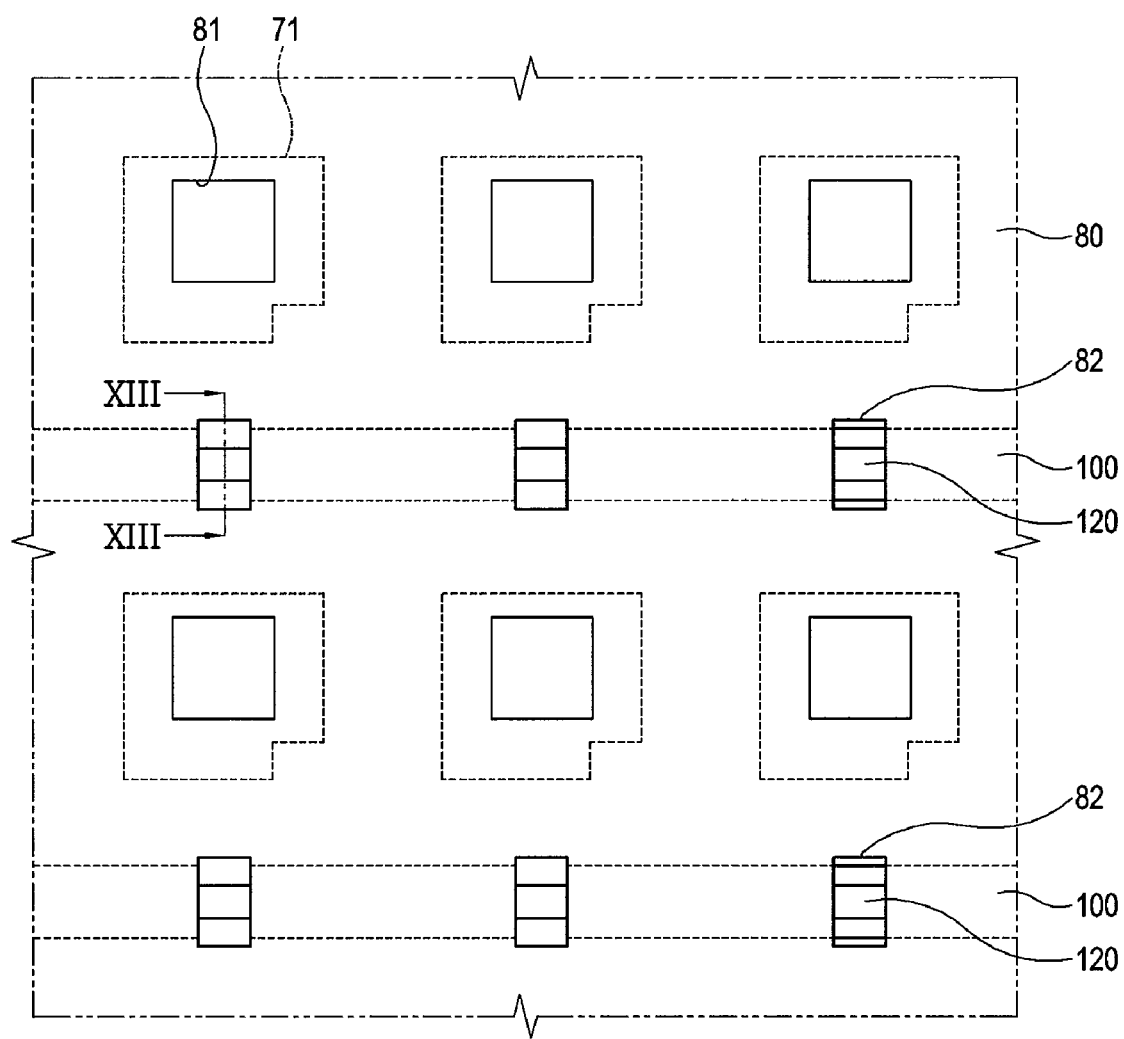
FIG. 12 is a plane view varying a shape of a contact hole in FIG. 11.

As shown in FIG. 11, a side surface of a common voltage applying layer 100 is exposed in a lengthwise direction by a contact hole 82 as shown in FIG. 4. Alternatively, as shown in FIG. 12, the side surface of the common voltage applying layer 100 may be exposed in the lengthwise direction by a plurality of contact holes 82 as shown in FIG. 5.

Figure 13:
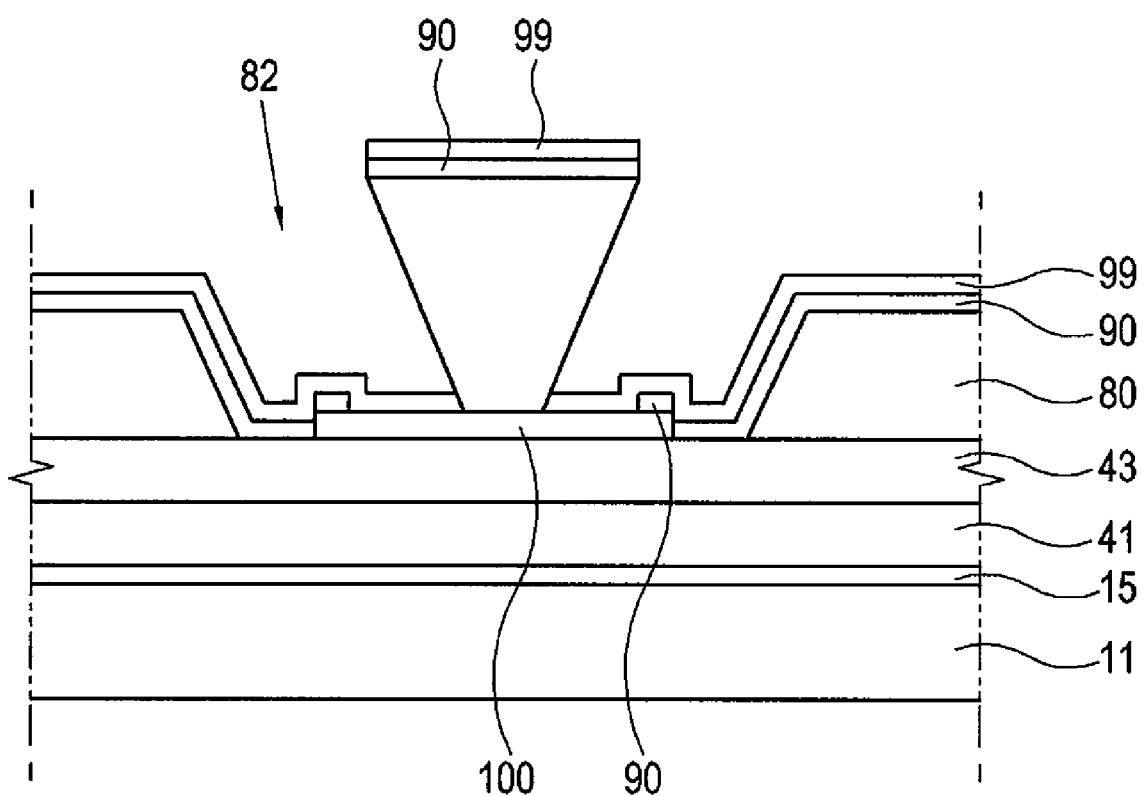
FIG. 13 is a sectional view taken along line XIII-XIII in FIGS. 11 and 12.

As shown in FIG. 13, a layering preventing column 120 is formed on an upper surface of the common voltage applying layer 100. An upper surface 121 of the layering preventing column 120 according to the present exemplary embodiment of the present invention is narrower than the width of the common voltage applying layer 100. Alternatively, the upper surface 121 of the layering preventing column 120 may be wider than the width of the common voltage applying layer 100, and may be wider than the contact hole 82.

Hereinafter, a manufacturing method of the display device according to the third exemplary embodiment of the present invention will be described by referring to FIGS. 14A to 14C.

Figure 14A:
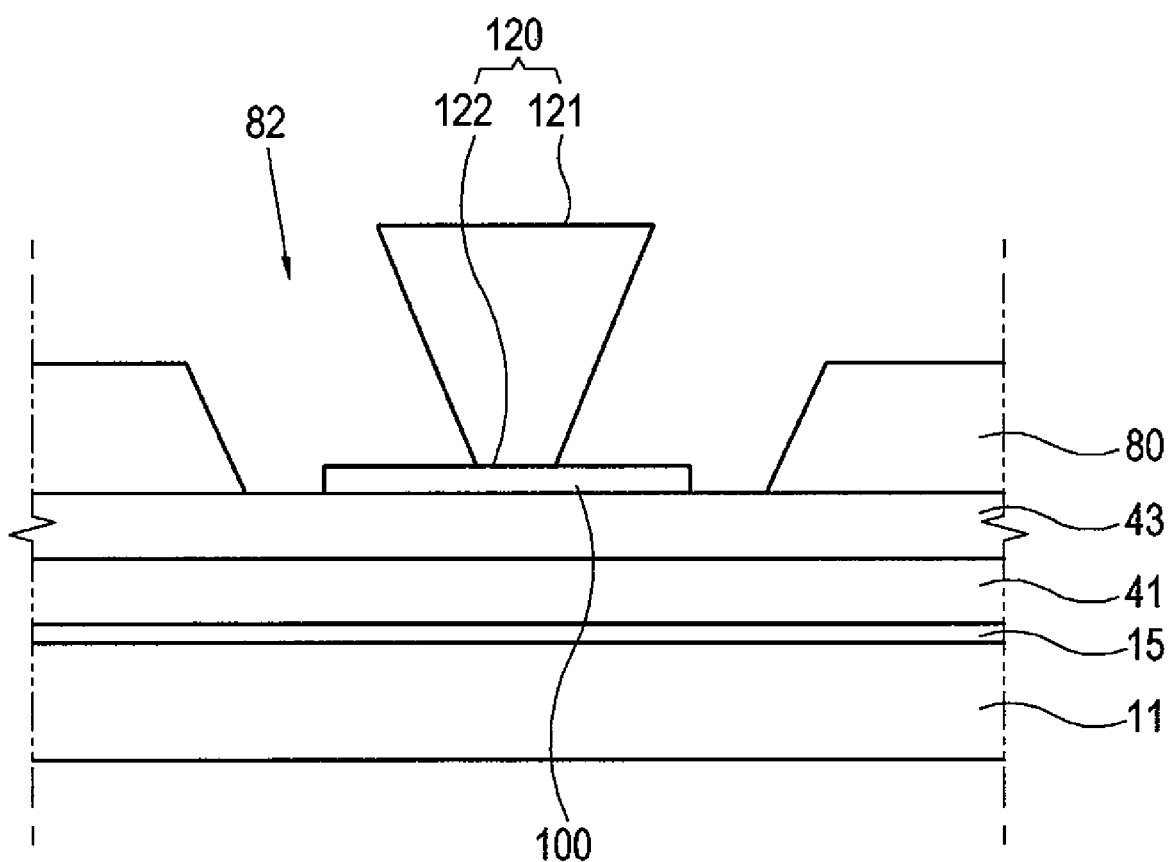
FIGS. 14A and 14B are sectional views illustrating a manufacturing method of the third exemplary embodiment of the present invention.

As shown in FIG. 14A, the layering preventing column 120 is formed on the common voltage applying layer 100 shown in FIG. 8B. The layering preventing column 120 may be formed by the same method as the second exemplary embodiment of the present invention.

Figure 14B:
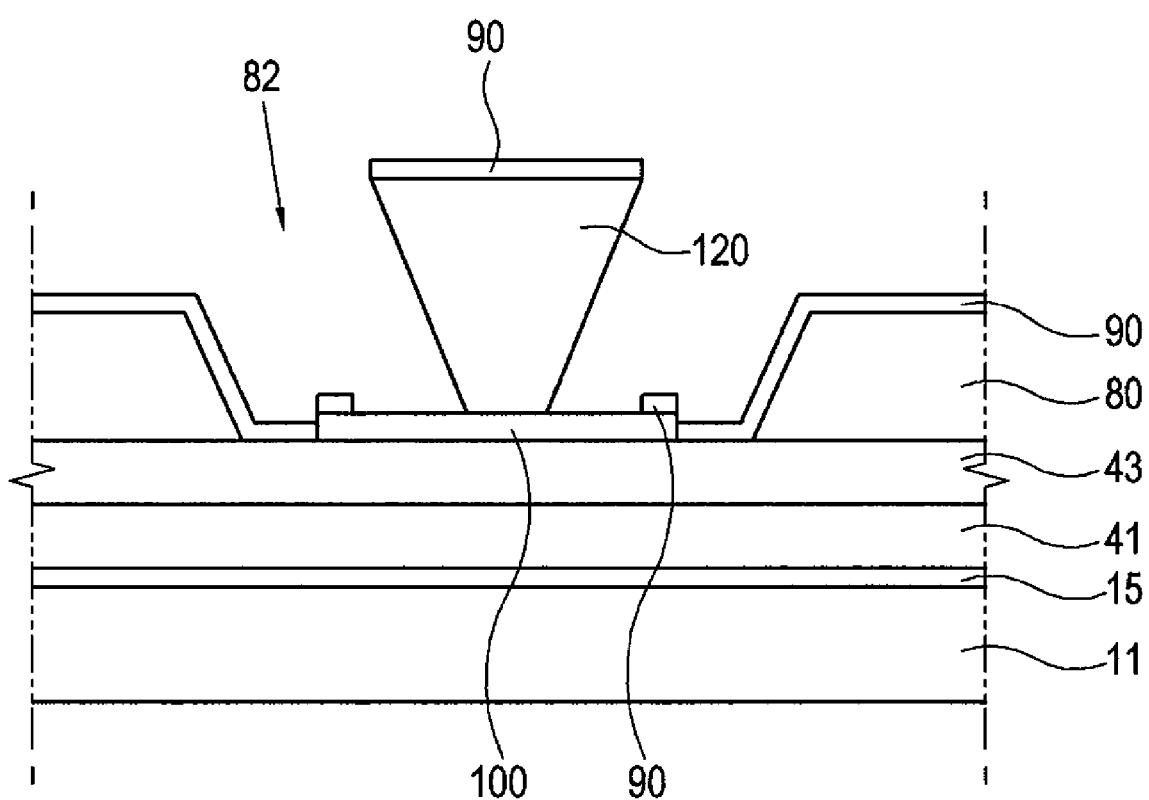

As shown in FIG. 14B, an organic layer 90 is formed on an organic insulating layer 80, the layering preventing column 120 and an upper part of the common voltage applying layer 100. According to the present exemplary embodiment of the present invention, a plurality of organic layers 90 including no emitting material layer 91 are formed by a thermal evaporation by using an open mask. The organic layer 90 may be formed by the same method as the first exemplary embodiment. Accordingly, a plurality of organic layers 90 can be formed on the organic insulating layer 80, the layering preventing column 120, an upper surface 121 of the layering preventing column 120, a distanced area C and an upper surface of the common voltage applying layer 100 deviating from the upper surface of the layering preventing column 120. The thickness of the organic layer 90 formed to the distanced area C is smaller than the thickness of the common voltage applying layer 100. In case of using the thermal evaporation, since an organic material forming the organic layer 90 is emitted in a perpendicular direction to the common voltage applying layer 100 and the distanced area C, the organic material can be prevented from being forming to a side surface contact portion 105 of the common voltage applying layer 100.

Then, as shown in FIG. 13, a common electrode 99 is formed on the organic layer 90, and the common voltage applying layer 100 on which the organic layer 90 is not formed. The common electrode 99 according to the present exemplary embodiment of the present invention may be formed of a transparent conductive material such as ITO or IZO, or may be formed to be translucent by thinly laminating metal such as nickel or chrome. The common electrode 99 may be formed by the same method as the first exemplary embodiment. Accordingly, the display device according to the third exemplary embodiment of the present invention can electrically connect the common electrode 99 to the side surface contact portion 105 of the common voltage applying layer 100 and an upper area of the common voltage applying layer 100 to apply an appropriate common voltage to the common electrode 99. Also, the display device according to the third exemplary embodiment of the present invention can easily contact the common electrode 99 to the side surface contact portion 105 of the common voltage applying layer 100 in spite of forming the organic layer 90 to an area in which the common voltage applying layer 100 is formed by using the open mask.

The third exemplary embodiment of the present invention may be further provided with a sub common voltage applying layer 110 as shown in FIG. 7. The sub common voltage applying layer 110 may have the same configuration as the first exemplary embodiment of the present invention.

As described above, the display device according to the present invention can easily contact the common voltage applying layer to the common electrode, and stably and easily contact the common voltage applying layer to the common electrode in spite of forming the organic layer by using the open mask, thereby simplifying a manufacturing process and reducing a manufacturing cost.

As described above, the present invention provides a display device simplifying a manufacturing process, and reducing a manufacturing cost.

Also, the present invention provides a manufacturing method of a display device simplifying a manufacturing process, and reducing a manufacturing cost.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display device, comprising:
    an insulating substrate;
    a common electrode disposed on the insulating substrate;
    a common voltage applying layer disposed between the insulating substrate and the common electrode, the common voltage applying layer having an upper surface facing the common electrode and a side surface; and
    an organic insulating layer which is disposed between the insulating substrate and the common electrode, and is formed with a contact hole which exposes at least a part of the side surface of the common voltage applying layer,
    the common electrode electrically connected to the common voltage applying layer in the side surface of which is exposed through the contact hole.

2. The display device according to claim 1, wherein the side surface contact portion is elongated in a lengthwise direction of the common voltage applying layer.

3. The display device according to claim 1, wherein the side surface contact portion is formed in plural and disposed in the lengthwise direction of the common voltage applying layer.

4. The display device according to claim 1, wherein an outer angle between the side surface of the common voltage applying layer which is exposed through the contact hole, and the insulating substrate is less than 90 degree.

5. The display device according to claim 1, wherein the common voltage applying layer is formed as multi layers, and the area of an upper layer of the common voltage applying layer is bigger than the area of a lower layer thereof.

6. The display device according to claim 1, further comprising:
    a pixel electrode which is formed between the insulating substrate and the common electrode, and
    an emitting material layer which is formed between the pixel electrode and the common electrode,
    wherein a light which is generated from the emitting material layer is emitted out through the common electrode.

7. The display device according to claim 1, further comprising:
    a distanced area which is exposed by the contact hole, and is formed so that at least a part of the side surface of the common voltage applying layer can be distanced from the organic insulating layer, and
    an organic layer which is formed on the distanced area, wherein the organic layer has a smaller thickness than the common voltage applying layer.

8. The display device according to claim 7, wherein at least a part of the organic layer which is formed on the distanced area is formed by a thermal evaporation.

9. The display device according to claim 7, wherein the thickness of the common voltage applying layer is 2000 Å to 4000 Å.

10. The display device according to claim 6, wherein the common voltage applying layer is formed as the same layer as the pixel electrode.

11. The display device according to claim 10, further comprising a sub common voltage applying layer which is positioned between the common voltage applying layer and the insulating substrate, and is electrically connected with the common voltage applying layer,
    wherein a common voltage is applied to at least one of the common voltage applying layer and the sub common voltage applying layer.

12. The display device according to claim 1, wherein the contact hole further comprises a layering preventing column which exposes at least a part of the upper surface of the common voltage applying layer, contacts with the exposed part of the upper surface of the common voltage applying layer, and comprises a lower surface which contacts with the common voltage applying layer and an upper surface which has a bigger area than the lower surface, and
    the common electrode is electrically connected to the exposed upper surface of the common voltage applying layer which is out of contact with the layer preventing column.

13. The display device according to claim 12, further comprising:
    a distanced area which is exposed by the contact hole, and is formed so that at least one part of the side surface of the common voltage applying layer can be distanced from the organic insulating layer, and
    an organic layer which is formed on the distanced area, wherein the organic layer has a smaller thickness than the common voltage applying layer.

14. The display device according to claim 1, wherein the common electrode contacts the common voltage applying layer.

* * * * *